United States Patent
Jang

(10) Patent No.: US 9,842,799 B2
(45) Date of Patent: Dec. 12, 2017

(54) SEMICONDUCTOR PACKAGES INCLUDING UPPER AND LOWER PACKAGES AND HEAT DISSIPATION PARTS

(71) Applicant: Samsung Electronics Co., Ltd, Suwon-Si, Gyeonggi-do (KR)

(72) Inventor: Eon Soo Jang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/885,566

(22) Filed: Oct. 16, 2015

(65) Prior Publication Data
US 2016/0118366 A1    Apr. 28, 2016

(30) Foreign Application Priority Data
Oct. 27, 2014    (KR) .......................... 10-2014-0146284

(51) Int. Cl.
| | | |
|---|---|---|
| H01L 23/367 | (2006.01) | |
| H01L 23/498 | (2006.01) | |
| H01L 25/10 | (2006.01) | |
| H01L 25/065 | (2006.01) | |

(52) U.S. Cl.
CPC ...... *H01L 23/49838* (2013.01); *H01L 23/367* (2013.01); *H01L 25/105* (2013.01); *H01L 25/0652* (2013.01); *H01L 25/0655* (2013.01); *H01L 2224/16225* (2013.01); *H01L 2224/16227* (2013.01); *H01L 2224/32145* (2013.01); *H01L 2224/32245* (2013.01); *H01L 2224/73253* (2013.01); *H01L 2225/06562* (2013.01); *H01L 2225/107* (2013.01); *H01L 2225/1023* (2013.01); *H01L 2225/1058* (2013.01); *H01L 2225/1094* (2013.01); *H01L 2924/1431* (2013.01); *H01L 2924/1434* (2013.01); *H01L 2924/1436* (2013.01); *H01L 2924/1438* (2013.01); *H01L 2924/15311* (2013.01); *H01L 2924/15331* (2013.01); *H01L 2924/181* (2013.01); *H01L 2924/18161* (2013.01)

(58) Field of Classification Search
None
See application file for complete search history.

(56) References Cited

U.S. PATENT DOCUMENTS

| | | | |
|---|---|---|---|
| 5,808,875 A | 9/1998 | McMahon et al. | |
| 5,859,477 A | 1/1999 | Fehr | |
| 7,098,542 B1* | 8/2006 | Hoang | H01L 23/13 257/686 |
| 7,372,141 B2 | 5/2008 | Karnezos et al. | |
| 7,683,469 B2 | 3/2010 | Oh et al. | |
| 8,227,338 B1 | 7/2012 | Scanlan et al. | |
| 8,269,298 B2 | 9/2012 | Nagamatsu et al. | |
| 8,519,537 B2* | 8/2013 | Jeng | H01L 23/13 257/668 |
| 8,546,929 B2 | 10/2013 | Ong et al. | |

(Continued)

FOREIGN PATENT DOCUMENTS

KR    20130035805 A    4/2013

*Primary Examiner* — Bilkis Jahan
(74) *Attorney, Agent, or Firm* — Ward and Smith, P.A.

(57) ABSTRACT

A semiconductor package includes a lower package with a lower substrate and a lower semiconductor chip. A heat dissipation part is provided adjacent to a side of the lower package and covers a portion of the lower semiconductor chip, and an upper package is on the lower package and is laterally spaced apart from the heat dissipation part.

18 Claims, 14 Drawing Sheets

(56) References Cited

U.S. PATENT DOCUMENTS

| | | |
|---|---|---|
| 8,749,043 B2 | 6/2014 | Yu et al. |
| 8,796,835 B2 | 8/2014 | Kim et al. |
| 8,901,730 B2 | 12/2014 | Liu et al. |
| 2003/0116349 A1* | 6/2003 | Hashimoto ....... H01L 23/49805 174/260 |
| 2004/0124520 A1* | 7/2004 | Rinne ..................... H01L 24/13 257/686 |
| 2011/0024888 A1* | 2/2011 | Pagaila ................. H01L 23/13 257/686 |
| 2012/0018871 A1* | 1/2012 | Lee .................... H01L 25/0655 257/698 |
| 2013/0093073 A1 | 4/2013 | Chen et al. |
| 2013/0100616 A1* | 4/2013 | Zohni .................... H01L 23/13 361/735 |
| 2013/0307140 A1* | 11/2013 | Huang ............. H01L 23/49827 257/737 |
| 2014/0097532 A1 | 4/2014 | Chiang et al. |
| 2014/0124955 A1 | 5/2014 | Chen et al. |
| 2015/0255441 A1* | 9/2015 | Lamorey ................ H01L 25/18 257/704 |

\* cited by examiner

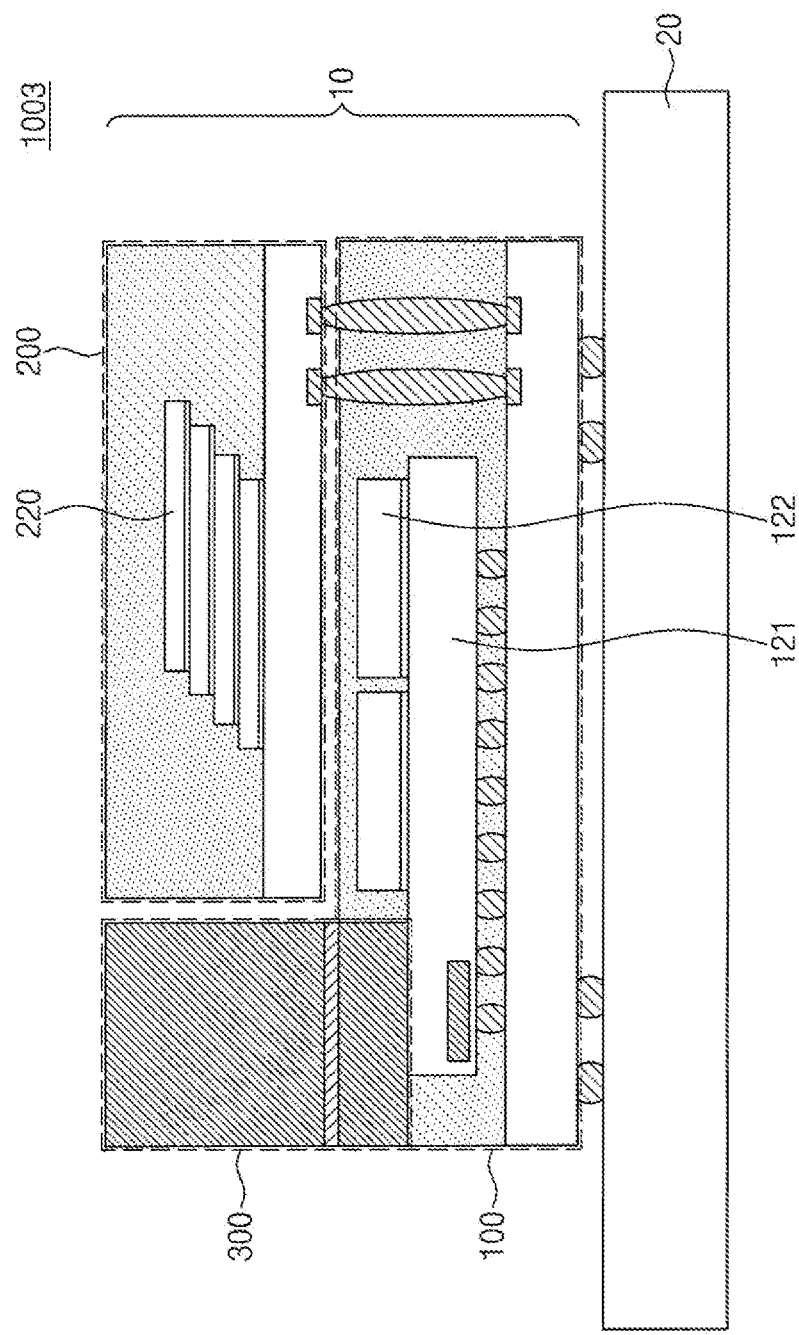

SEMICONDUCTOR PACKAGES INCLUDING UPPER AND LOWER PACKAGES AND HEAT DISSIPATION PARTS

CROSS-REFERENCE TO RELATED APPLICATIONS

This U.S. non-provisional patent application claims priority under 35 U.S.C. §119 to Korean Patent Application No. 10-2014-0146284, filed on Oct. 27, 2014, in the Korean Intellectual Property Office, the disclosure of which is hereby incorporated by reference.

BACKGROUND

The inventive concepts disclosed herein relate to semiconductor packages, and in particular, to semiconductor packages with a plurality of semiconductor chips.

A continuing goal of the electronic industry is to manufacture cost-effectively light, small, fast, and high-performance electronic products. Electronic products typically include one or more semiconductor chips provided in a semiconductor package. Various studies are being conducted to improve the reliability of semiconductor packages. In particular, with increasing demand for semiconductor devices capable of providing fast speed and increased capacity, semiconductor devices may consume increasingly larger amounts of electric power. Thermal characteristics of the semiconductor packages are therefore becoming more and more important.

SUMMARY

Example embodiments of the inventive concept provide a semiconductor package in which a semiconductor chip having an improved heat-dissipation property is provided.

According to example embodiments of the inventive concept, a semiconductor package may include a lower package including a lower substrate and a lower semiconductor chip on the lower substrate and having a first region and a second region. The first region is adjacent to a first side of the lower substrate and the second region is adjacent to a second side facing the first side.

A heat dissipation part is provided on the first region of the lower package to cover a portion of the lower semiconductor chip, and an upper package is provided on the second region of the lower package. The heat dissipation part covers a first portion of the lower semiconductor chip in the first region of the lower package and exposes a second portion of the lower semiconductor chip in the second region of the lower package. In example embodiments, the upper package is stacked vertically on the lower package, and the upper package is spaced apart from the first region laterally.

In example embodiments, the lower semiconductor chip may include a hot spot positioned therein. The heat dissipation part is stacked vertically on the lower package, and the hot spot may be positioned in the first region and may overlap with the heat dissipation part, when viewed in a plan view.

In example embodiments, the hot spot may be positioned in a portion of the lower semiconductor chip that is adjacent to the first side of the lower substrate.

In example embodiments, the semiconductor package may further include an interposer substrate provided on the second region of the lower package and between the lower and upper packages.

In example embodiments, the semiconductor package may further include connecting portions provided between the lower substrate and the interposer substrate, and interposers provided between the interposer substrate and the upper package. When viewed in a plan view, the interposers may be disposed above positions of the lower substrate that are different from those at which the connecting portions are positioned.

In example embodiments, the semiconductor package may further include connecting portions provided on the lower substrate to connect the upper package electrically to the lower package, wherein the connecting portions may be disposed on the second region of the lower package.

In example embodiments, the lower semiconductor chip may include a first lower semiconductor chip and a second lower semiconductor chip that may be of a different type from the first lower semiconductor chip.

In example embodiments, the upper package may include an upper substrate and a plurality of upper semiconductor chips mounted on the upper substrate.

The heat dissipation part may include a first portion above the first region of the lower package and a second portion above the second region of the lower package, and the first portion of the heat dissipation part may have a first height that is greater than a second height of the second portion of the heat dissipation part In example embodiments, the heat dissipation part may include a heat slug on the lower semiconductor chip, and a thermal interface material layer in a gap region between the lower semiconductor chip and the heat slug.

According to example embodiments of the inventive concept, a semiconductor package may include a lower package including a lower substrate and a lower semiconductor chip, an upper package mounted on the lower package and exposing a portion of the lower semiconductor chip, and a heat dissipation part provided adjacent to a first side of the lower substrate on the exposed portion of the lower semiconductor chip.

In example embodiments, the lower semiconductor chip may have a hot spot therein, and the heat dissipation part may overlap with the hot spot, when viewed in a plan view In example embodiments, a space between the lower semiconductor chip and the first side of the lower substrate may be smaller than that between the lower semiconductor chip and a second side of the lower substrate, and the second side may be opposite to the first side In example embodiments, the heat dissipation part may have thermal conductivity higher than the thermal conductivity of the upper package.

In example embodiments, the lower package may further include a lower mold layer provided on the lower substrate, and the lower mold layer covers side surfaces of the lower semiconductor chip and exposes a top surface of the lower semiconductor chip.

In example embodiments, the heat dissipation part may include a heat slug on the lower semiconductor chip, and a thermal interface material layer in gap regions between the lower semiconductor chip and the heat slug and between the lower semiconductor chip and the upper package.

In example embodiments, the semiconductor package may further include an upper thermal interface material layer filling a gap region between the heat dissipation part and the upper package.

According to example embodiments of the inventive concept, a semiconductor package includes a lower package with a hot spot region therein, a heat dissipation part provided on the hot spot region of the lower package, and an upper package provided on the lower package to be laterally spaced apart from the heat dissipation part.

In example embodiments, the lower package may include a lower substrate and a lower semiconductor chip mounted on the lower substrate, and the hot spot region may be positioned in the lower semiconductor chip and adjacent to a first side of the lower substrate.

In example embodiments, the lower package may include a plurality of lower semiconductor chips, and the upper package may include a plurality of upper semiconductor chips.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 5A through 5C are sectional views illustrating package modules according to example embodiments of the inventive concept.

Figure 1A:
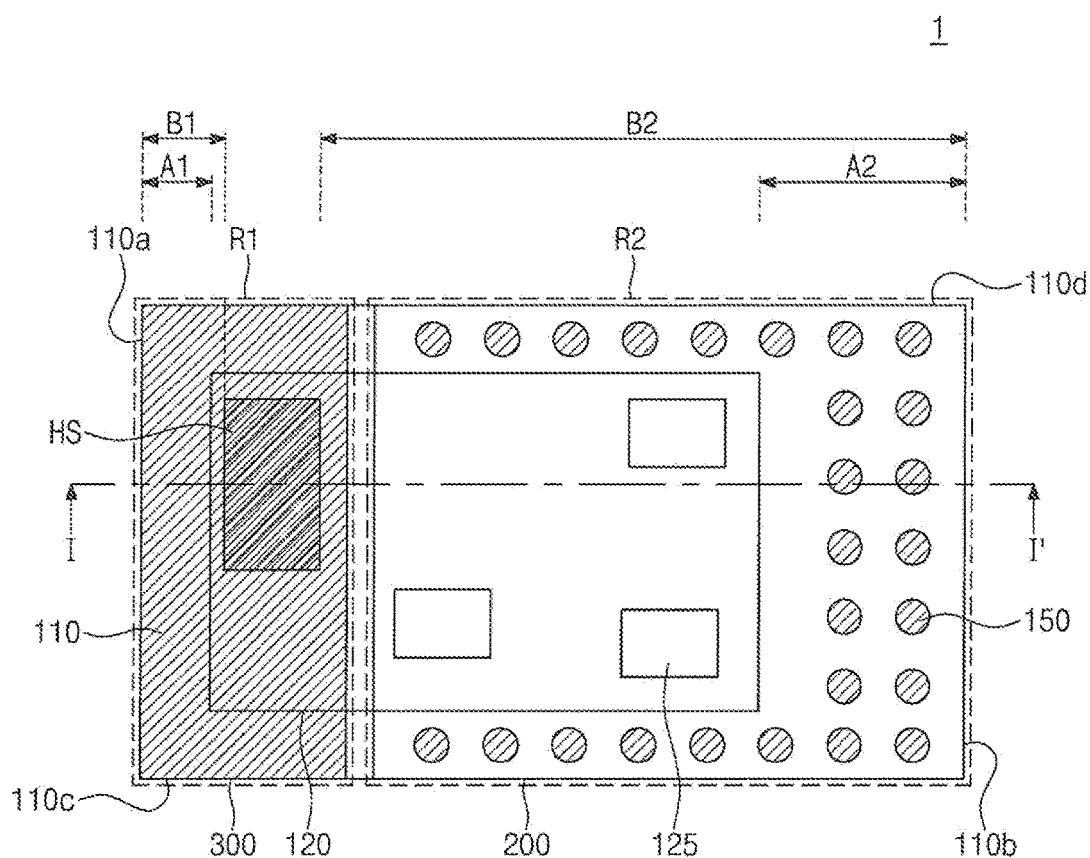
FIG. 1A is a plan view illustrating a semiconductor package according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the this specification and the relevant art and will not be interpreted in an idealized or overly formal sense unless expressly so defined herein.

Hereinafter, semiconductor packages according to example embodiments of the inventive concept will be described with reference to the drawings.

Figure 1B:
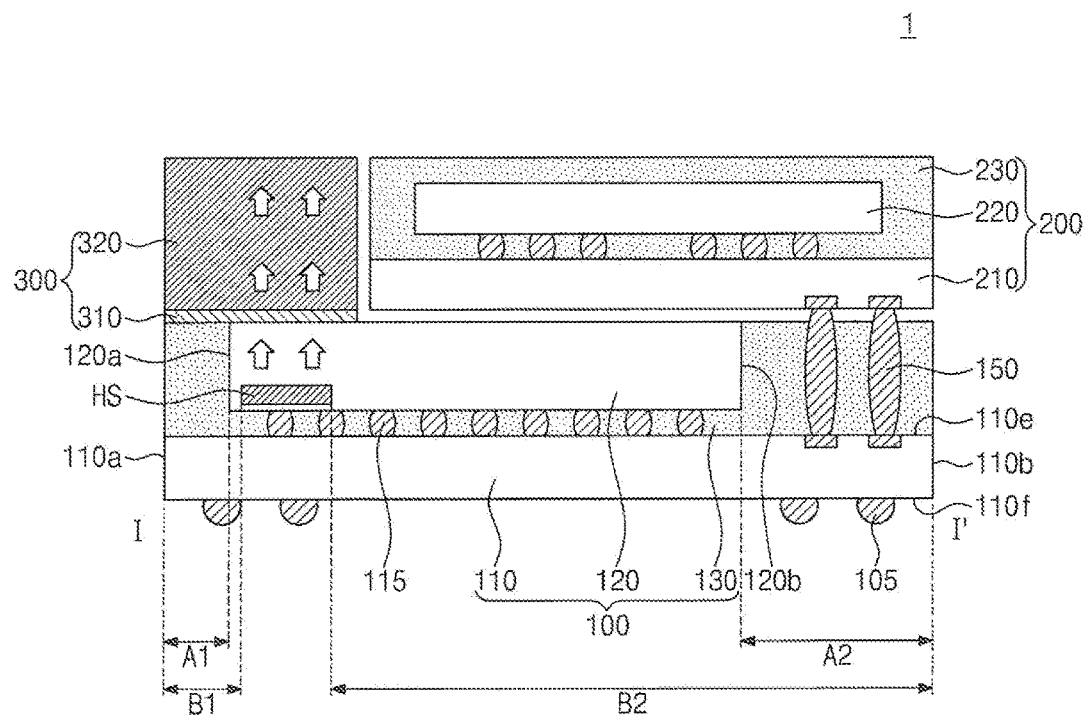
FIG. 1B is a sectional view taken along line I-I' of FIG. 1A.

FIG. 1A is a plan view illustrating a semiconductor package according to example embodiments of the inventive concept, and FIG. 1B is a sectional view taken along line I-I' of FIG. 1A.

Referring to FIGS. 1A and 1B, a semiconductor package 1 may include a lower package 100, an upper package 200, and a heat dissipation part 300. The lower package 100 may include a lower substrate 110, a lower semiconductor chip 120, and a lower mold layer 130. The lower substrate 110 may be a printed circuit board (PCB) with circuit patterns. The lower package 100 may include a first region R1 and a second region R2, when viewed in a plan view. The first region R1 may be adjacent to a first side 110a of the lower substrate 110, and the second region R2 may be adjacent to a second side 110b of the lower substrate 110. Here, the second side 110b may be positioned to face the first side 110a. The first side 110a and the second side 110b may extend between a top surface 110e and a bottom surface 110f of the lower substrate 110. The lower semiconductor chip 120 is mounted on the top surface 110d of the lower substrate 110. An outer terminal 105 may be disposed on a bottom surface of the lower substrate 110. The outer terminal 105 may include a conductive material and may be provided in the form of a solder ball.

The lower semiconductor chip 120 may be mounted on a top surface of the lower substrate 110. The lower semiconductor chip 120 may include integrated circuits (e.g., logic circuits, memory circuits, analog circuits, etc.). Connection terminals 115 may be provided between the lower substrate 110 and the lower semiconductor chip 120 to connect the lower semiconductor chip 120 electrically to the lower substrate 110. The connection terminals 115 may include a conductive material (e.g., metal) and may be provided in the form of solders, bumps, or pillars. As another example, the lower semiconductor chip 120 may be electrically connected to the lower substrate 110 via bonding wires (not shown).

The lower semiconductor chip 120 may be disposed adjacent to the first side 110a of the lower substrate 110. For example, a space A1 between the lower semiconductor chip 120 and the first side 110a of the lower substrate 110 may be smaller than a space A2 between the lower semiconductor chip 120 and the second side 110b of the lower substrate 110.

Referring to FIG. 1A, the lower semiconductor chip 120 may include a plurality of functional blocks 125 that generate heat when the lower semiconductor chip 120 is operated. At least one of the functional blocks 125 may emit more heat than a predetermined level of heat, and, hereinafter, such a functional block will be referred to as a "hot spot HS". A single semiconductor chip may have one hot spot, no hot spots or multiple hot spots. The predetermined level of heat may be a level of heat that could damage another semiconductor chip.

The functional blocks 125 may be a central processing unit (CPU), a memory interface, an IP block (e.g., a universal serial bus (USB)), a power transistor, etc. An IP block is a block in which functions required to configure a semiconductor integrated circuit are provided in the form of a hardware or software. As shown in FIG. 1A, when viewed in a plan view, the hot spot HS is disposed within the first region R1 of the lower substrate 110. The hotspot may partially or fully overlap with the first region R1 of the lower substrate 110. Moreover, although not illustrated in FIG. 1A, multiple hot spots HS may partially or fully overlap with the first region R1 of the lower substrate 110. The hot spot HS may be disposed adjacent to a side 120a of the lower semiconductor chip 120 and the first side 110a of the lower substrate 110. The side 120a of the lower semiconductor chip 120 may be positioned toward or adjacent to the first side 110a of the lower substrate 110. For example, a space B1 between the hot spot HS and the first side 110a of the lower substrate 110 may be smaller than a space B2 between the hot spot HS and the second side 110b of the lower substrate 110. The space between the hot spot HS and the side 120a of the lower semiconductor chip 120 (equal to B1-A1) may be smaller than the space between the hot spot HS and other side 120b of the lower semiconductor chip 120 (equal to B2-A2).

The upper package 200 may include an upper substrate 210, an upper semiconductor chip 220, and an upper mold layer 230. The upper substrate 210 may be a printed circuit board (PCB). The upper semiconductor chip 220 may be mounted on the upper substrate 210. The upper semiconductor chip 220 may include integrated circuits (e.g., memory circuits). As an example, the upper semiconductor chip 220 may be a DRAM or FLASH memory chip. The upper semiconductor chip 220 may be mounted on the upper substrate 210 using a die bonding process or a flip-chip bonding process. Alternatively, the upper semiconductor chip 220 may be electrically connected to the upper substrate 210 via bonding wires (not shown). The upper mold layer 230 may be provided on the upper substrate 210 to cover the upper semiconductor chip 220.

Connecting portions 150 may be disposed between the lower substrate 110 and the upper substrate 210. The upper package 200 may be electrically connected to the lower substrate 110 via the connecting portions 150. Since the lower semiconductor chip 120 is disposed adjacent to the first side 110a, the connecting portions 150 may be provided on the top surface 110e of the lower substrate 110 and adjacent to at least one of the second to fourth sides 110b, 110c, and 100d. Here, the third side 110c and the fourth side 110d may be adjacent to the second side 110b. When viewed in a plan view, the connecting portions 150 may be provided in an edge region of the second region R2 of the lower substrate 110 and may not be provided on the first region R1 of the lower substrate 110. The connecting portions 150 may be disposed around, but laterally spaced apart from, the lower semiconductor chip 120. The connecting portions 150 may include a conductive material (e.g., metals, conductive pastes, etc.).

The lower mold layer 130 may be provided on the top surface 110e of the lower substrate 110 and may fill gaps between the connecting portions 150 and between the connection terminals 115. The lower mold layer 130 may include an insulating polymer material (e.g., an epoxy molding compound). As another example, an under fill layer (not shown) may be further provided between the lower substrate 110 and the lower semiconductor chip 120. The lower mold layer 130 may not cover the top surface of the lower semiconductor chip 120 opposite the lower substrate 110. That is, the top surface of the lower semiconductor chip 120 may be exposed so that it can contact the heat dissipation part 300 and/or the air.

The heat dissipation part 300 may be disposed on the first region R1 of the lower package 100. For example, the heat dissipation part 300 may be disposed adjacent to the first side 110a of the lower substrate 110. The heat dissipation part 300 may include a thermal interface material (TIM) layer 310 and a heat slug 320, which are sequentially stacked on the lower semiconductor chip 120. The TIM layer 310 may be provided to be in contact with the top surface of the lower semiconductor chip 120.

As shown in FIG. 1A, when viewed in a plan view, the heat dissipation part 300 may overlap with the hot spot HS of the lower semiconductor chip 120. The heat slug 320 may include a material having a thermal conductivity that is higher than that of the air. For example, the heat slug 320 may include copper and/or aluminum. For example, copper may have thermal conductivity of about 401 W/mK, while air may have a thermal conductivity of about 0.025 W/mK, and thus, as shown in FIG. 1B, heat generated in the hot spot HS can be quickly exhausted to the outside through the heat dissipation part 300, when the lower semiconductor chip 120 is operated. The TIM layer 310 may include an adhesive material (e.g., polymer) and/or particles having high thermal conductivity (e.g., metallic particles). If the TIM layer 310 is not provided, an empty space filled with the air may be formed between the lower semiconductor chip 120 and the heat slug 320. However, according to example embodiments of the inventive concept, the TIM layer 310 having thermal conductivity higher than that of the air may be provided to fill such an empty space between the lower semiconductor chip 120 and the heat slug 320.

In some embodiments, the TIM layer 310 may have thermal conductivity ranging from about 2 W/mK to 3 W/mK and the air may have thermal conductivity of about 0.025 W/mK, and hence, heat generated from the lower semiconductor chip 120 can be more effectively transmitted to the heat slug 320 through the TIM layer 310. This makes it possible to improve the operational reliability of the lower semiconductor chip 120. In example embodiments, the heat dissipation part 300 may be provided to have substantially the same thickness as the upper package 200. The heat slug 320 may have thermal conductivity higher than that of the upper package 200. The upper package 200 may be disposed not to cover a top surface of the heat slug 320. For example, the upper package 200 may be spaced apart from the heat dissipation part 300 in the horizontal direction, and thus, heat transmitted to the heat dissipation part 300 can be easily exhausted to the outside through the top surface of the heat dissipation part 300.

The upper package 200 may be disposed on the lower package 100. As shown in FIG. 1A, the upper package 200 may partially or completely overlap with the second region R2 of the lower package 100 but may not overlap with the first region R1. The upper package 200 may have a planar area smaller than that of the lower package 100, and thus, the heat dissipation part 300 may be provided on the first region R1 of the lower package 100. The upper package 200 may be disposed spaced apart from the heat dissipation part 300 in a horizontal direction.

Heat generated from the lower semiconductor chip 120 may lead to deterioration in the reliability and/or operational speed of the upper semiconductor chip 220. According to example embodiments of the inventive concept, the upper package 200 may be disposed so as not to overlap with the hot spot HS in the lower semiconductor chip 120 and the heat dissipation part 300, when viewed in a plan view. Further, the heat slug 320 may be configured to have a thermal conductivity that is higher than that of the upper package 200, and may be spaced apart from the upper package 200 in the horizontal direction. Accordingly, when the semiconductor package 1 is operated, heat generated from the hot spot HS of the lower semiconductor chip 120 may not be substantially transmitted to the upper package 200. This makes it possible to improve reliability of the upper semiconductor chip 220. Further, this makes it possible to reduce the technical limitation to a type of the upper semiconductor chip 220. That is, the upper semiconductor chip 220 may include types of chips that could otherwise not be used due to heat generated by the hotspot HS. For example, it is possible to use a heat-sensitive semiconductor chip, such as a FLASH memory chip, as the upper semiconductor chip 220.

Figure 2A:
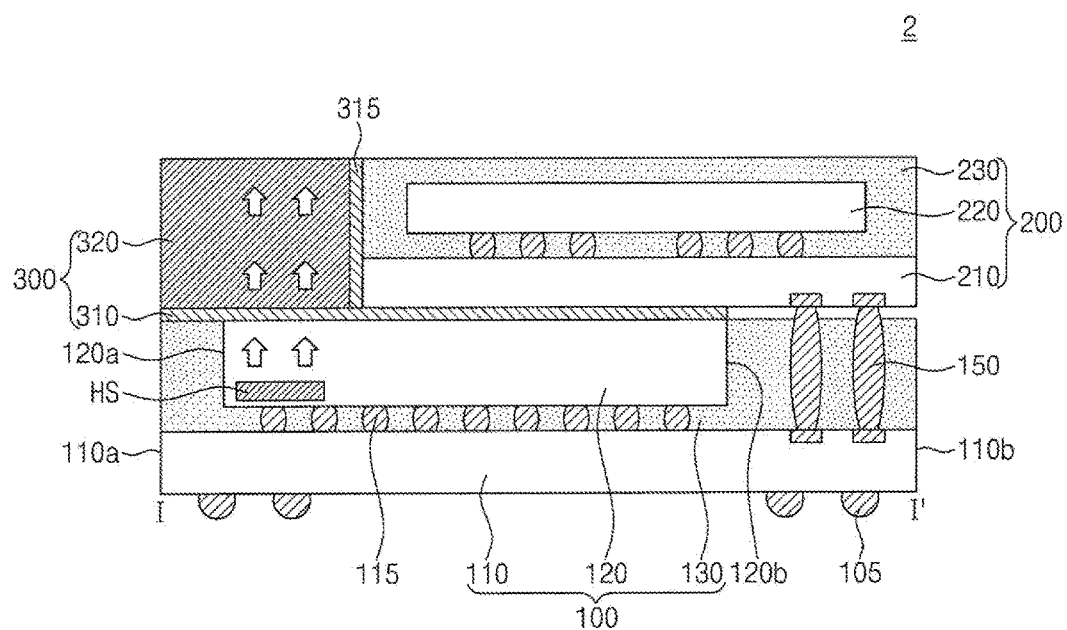
FIGS. 2A and 2B are sectional views illustrating semiconductor packages according to other example embodiments of the inventive concept.
Figure 2B:
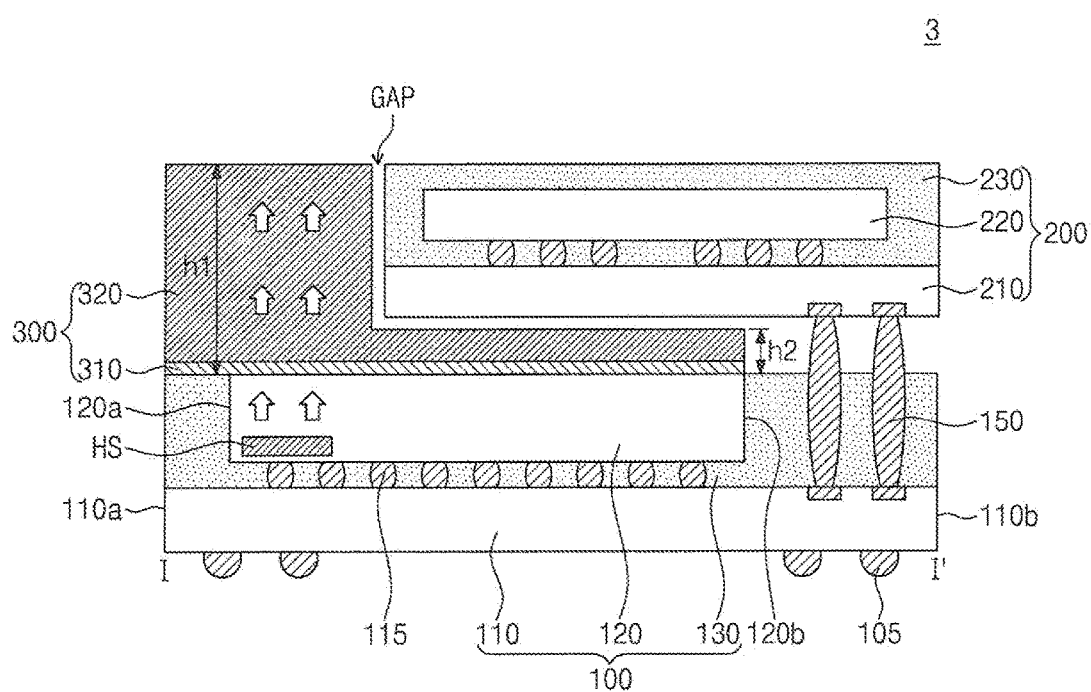

FIGS. 2A and 2B are sectional views illustrating semiconductor packages according to other example embodiments of the inventive concept. Here, FIGS. 2A and 2B illustrate sections corresponding to the line I-I' of FIG. 1A. For concise description, a previously described element may be identified by a similar or identical reference number without repeating an overlapping description thereof.

Referring to FIGS. 2A and 2B, a semiconductor package 2 or 3 may include the lower package 100, the upper package 200, and the heat dissipation part 300. Similar to the semiconductor package 1 previously described with reference to FIGS. 1A and 1B, the lower package 100 may include the lower substrate 110, the lower semiconductor chip 120, and the lower mold layer 130. When viewed in a plan view, the heat dissipation part 300 may be provided on the first region R1 of the lower package 100 and may overlap with the hot spot HS of the lower semiconductor chip 120. The upper package 200 may include the upper substrate 210, the upper semiconductor chip 220, and the upper mold layer 230, as described with reference to FIGS. 1A and 1B. Referring back to FIG. 1A, when viewed in a plan view, the upper package 200 may not overlap with the hot spot HS. In some embodiments, the heat dissipation part 300 may be provided on the first region R1 and a portion of the second region R2 of the lower package 100.

Figure 1C:
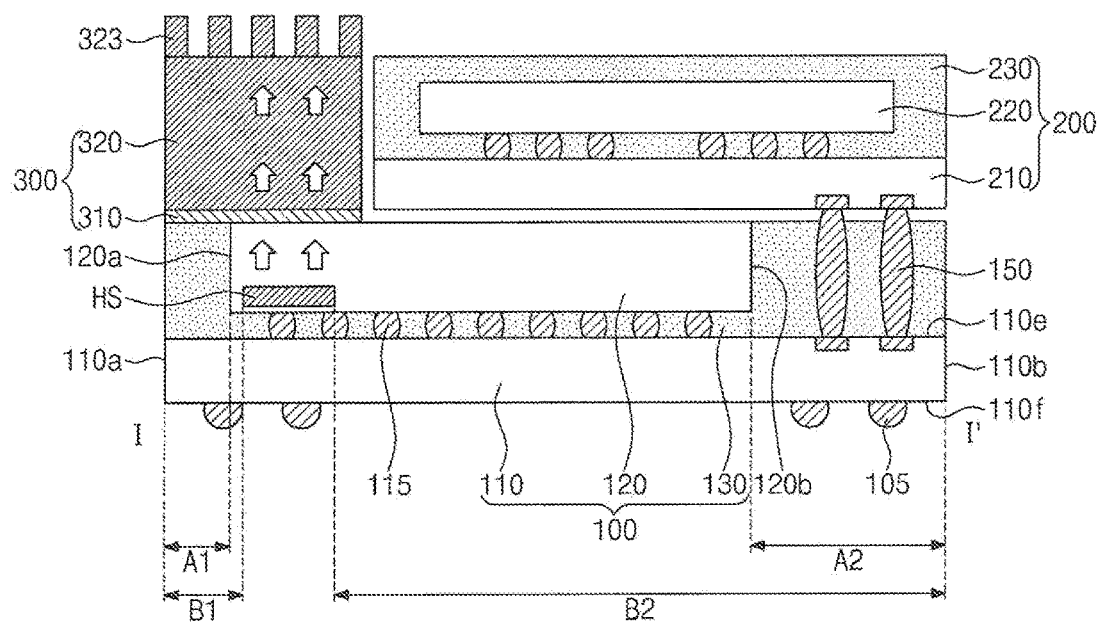
FIG. 1C is a sectional view taken along line I-I' of FIG. 1A according to further embodiments.

Referring to FIG. 1C, in some embodiments, three dimensional features, such as fins 323, may be formed on the heat slug 320 in order to increase a surface area thereof. Increasing the surface area of the heat slug 320 may enable heat to escape more quickly from the heat slug 320 and into an ambient, such as air. Such three dimensional surface area increasing features can be added to any of the heat slugs disclosed herein, and in particular to heat slugs that form an interface with a material having a lower thermal conductivity than the heat slug to increase heat transfer across the interface.

Referring to FIG. 2A in conjunction with FIG. 1A, the TIM layer 310 may cover the top surface of the lower semiconductor chip 120. For example, the TIM layer 310 may be provided to fill gap regions between the lower semiconductor chip 120 and the heat slug 320 and between the lower semiconductor chip 120 and the upper package 200. The TIM layer 310 may be spaced apart from the connecting portions 150 in the horizontal direction. In example embodiments, the TIM layer 310 may make it possible to more quickly discharge heat, which is generated from the heat sources 125 (e.g., of FIG. 1A) on the second region R2 of the lower semiconductor chip 120, to the heat slug 320. Further, an upper TIM layer 315 may be provided to fill a gap region between the heat slug 320 and the upper package 200. The upper TIM layer 315 may be connected to the TIM layer 310. In this case, heat generated from the upper package 200 can be transmitted to the heat slug 320 through not only the TIM layer 310 but also the upper TIM layer 315. In other example embodiments, the upper TIM layer 315 may be omitted, and the upper package 200 may be spaced apart from the heat slug 320. In still other example embodiments, the TIM layer 310 may not be provided on the second region R2 of the lower package 100, and the upper TIM layer 315 may be connected to the TIM layer 310 interposed between the lower semiconductor chip 120 and the heat slug 320.

Referring to FIG. 2B, the TIM layer 310 and the heat slug 320 may be provided on the first region R1 of the lower package 100. The TIM layer 310 and the heat slug 320 may extend into the second region R2, thereby having a portion interposed between the lower semiconductor chip 120 and the upper package 200. For example, the heat slug 320 may be provided to cover the top surface of the lower semiconductor chip 120 of the lower package 100 on not only the first region R1 but also the second region R2. The TIM layer 310 may be interposed between the lower package 100 and the heat slug 320. Disposition of the TIM layer 310 may be the same as or similar to that of the previous embodiment described with reference to FIG. 2A. A height h1 of the heat dissipation part 300 in the first region R1 may be greater than a height h2 of the heat dissipation part 300 in the second region R2 beneath the upper package 200.

In example embodiments, the TIM layer 310 may make it possible to more quickly discharge heat, which is generated from the hot spot HS and the heat sources 125 of the lower semiconductor chip 120, to the heat slug 320. The upper package 200 may be disposed spaced apart from the heat dissipation part 300, and thus, a gap GAP may be formed between the upper package 200 and the heat dissipation part 300. In this case, heat generated from the hot spot HS of the lower semiconductor chip 120 may not be substantially transmitted to the upper package 200. As another example, the upper TIM layer 315 may be further provided between the heat dissipation part 300 and the upper package 200, and the gap may be omitted. In this case, some heat generated from the upper package 200 may be transmitted to the heat dissipation part 300.

Figure 3A:
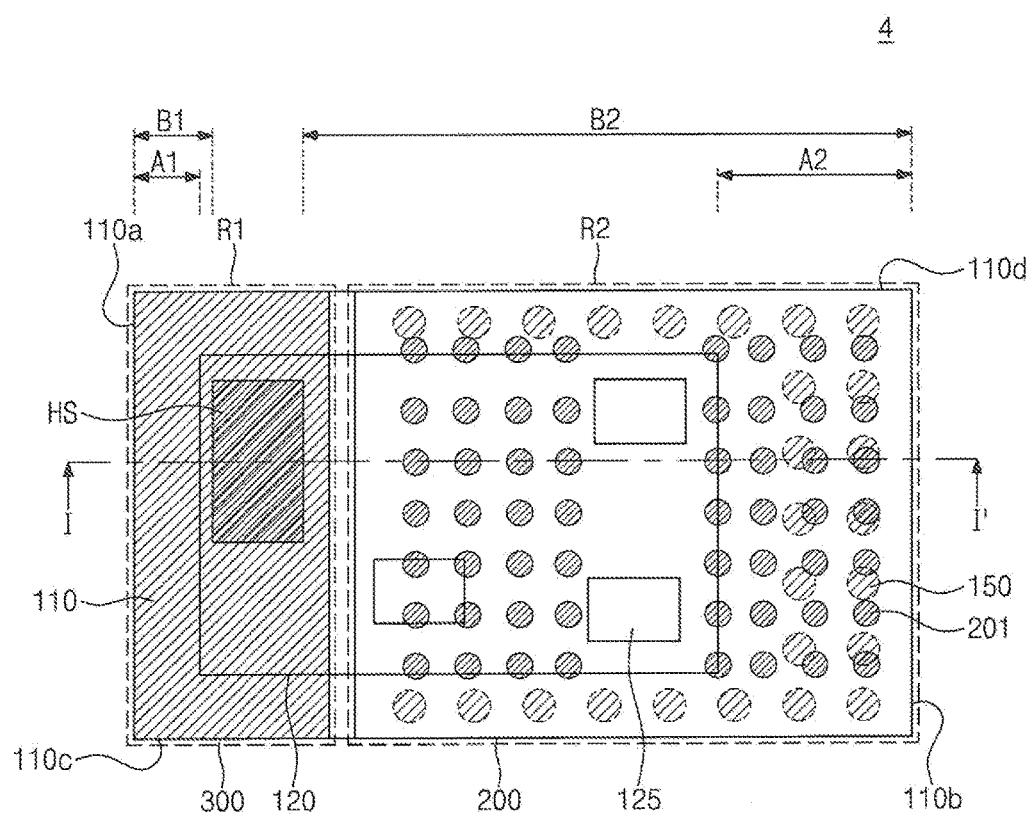
FIG. 3A is a plan view illustrating a semiconductor package according to still other example embodiments of the inventive concept.
Figure 3B:
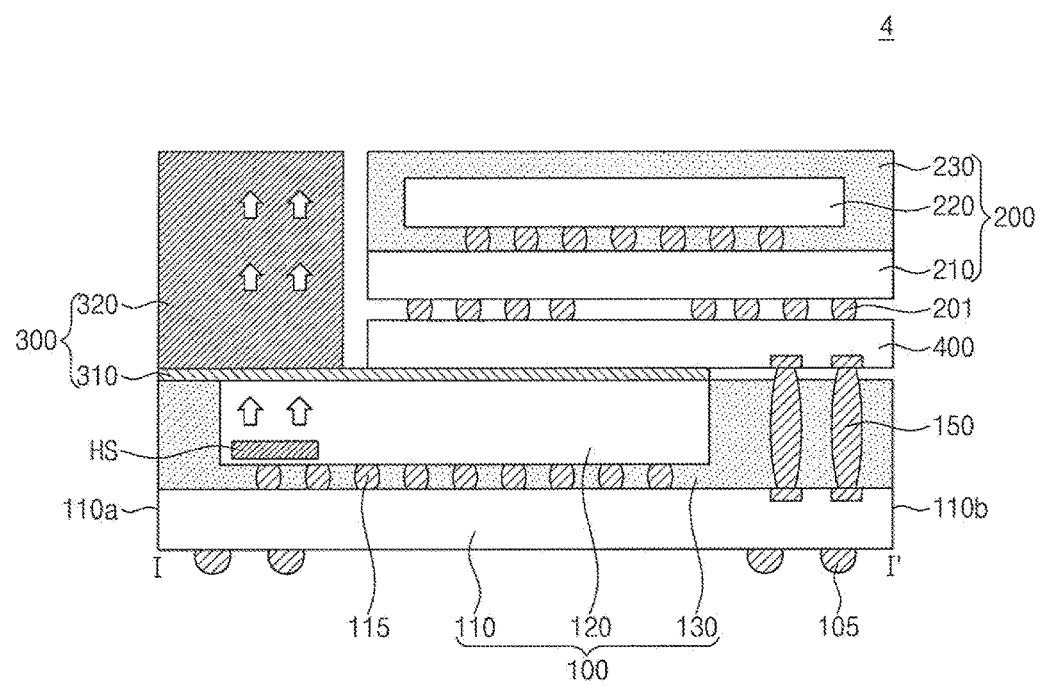
FIG. 3B is a sectional view taken along line I-I' of FIG. 3A.

FIG. 3A is a plan view illustrating a semiconductor package according to still other example embodiments of the inventive concept, and FIG. 3B is a sectional view taken along line I-I' of FIG. 3A. For concise description, a previously described element may be identified by a similar or identical reference number without repeating an overlapping description thereof.

Referring to FIGS. 3A and 3B, a semiconductor package 4 may include the lower package 100, the upper package 200, and the heat dissipation part 300, similar to the semiconductor package 1 previously described with reference to FIGS. 1A and 1B. The heat dissipation part 300 may be provided on the first region R1 of the lower package 100, and the upper package 200 may be provided on the second region R2 of the lower package 100. The heat dissipation part 300 may include the TIM layer 310 and the heat slug 320 which are sequentially stacked on the lower package 100.

Since the lower semiconductor chip 120 is disposed adjacent to the first side 110a, the connecting portions 150 may not be disposed on the top surface of the lower substrate 110 adjacent to the first side 110a, as shown in FIG. 1A. For example, the connecting portions 150 may be arranged on the top surface of the lower substrate 110 to be adjacent to at least one of the second to fourth sides 100b, 100c, and 110d. When viewed in a plan view, the connecting portions 150 may be provided on the edge region of the second region R2 of the lower substrate 110 and may not be provided on the first region R1 of the lower substrate 110.

Interposers 201 may be provided on a bottom surface of the upper substrate 210 to connect the upper package 200 electrically to the lower package 100. The number of the interposers 201 may be different from that of the connecting portions 150. For example, the number of the interposers 201 may be greater than that of the connecting portions 150. The interposers 201 may not be overlapped with the connecting portions 150, when viewed in a plan view. The interposers 201 may include a conductive material.

An interposer substrate 400 may be provided between the lower package 100 and the upper package 200. The interposers 201 may be electrically connected to the connecting portions 150 via the interposer substrate 400. The usage of the interposer substrate 400 may provide flexibility in configuring circuits of the upper substrate 210. For example, the number and planar arrangement of the interposers 201 may be more freely changed, compared to those of the connecting portions 150. As an example, the interposers 201 may be provided on a core portion of the second region R2 and a portion of the second region R2 adjacent to the first region R1.

Figure 4A:
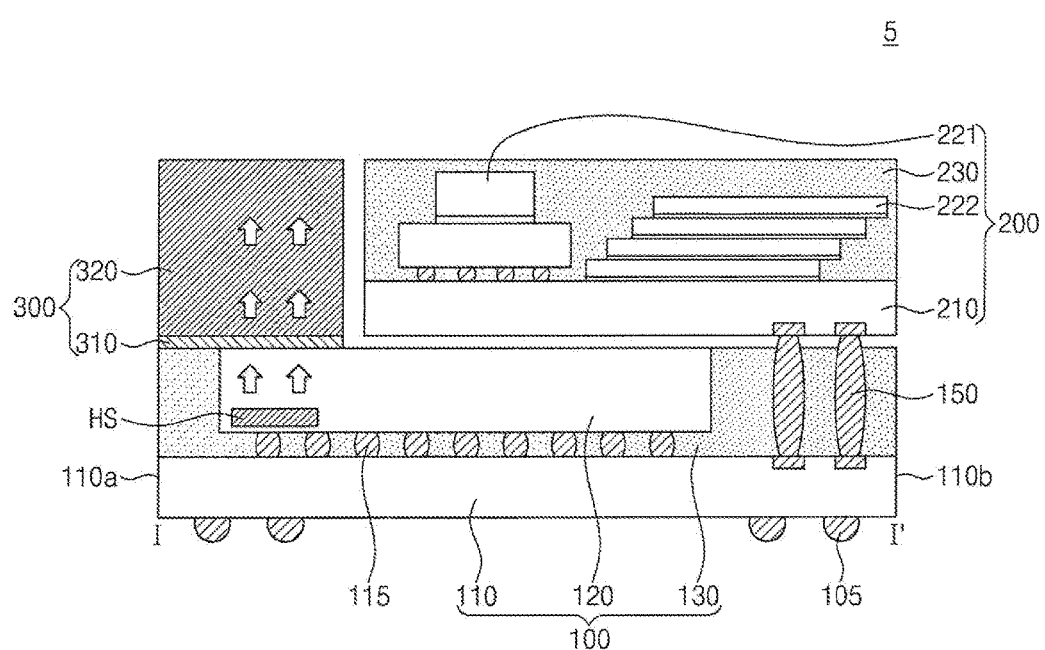
FIGS. 4A through 4C are sectional views illustrating semiconductor packages according to even other example embodiments of the inventive concept.
Figure 4B:
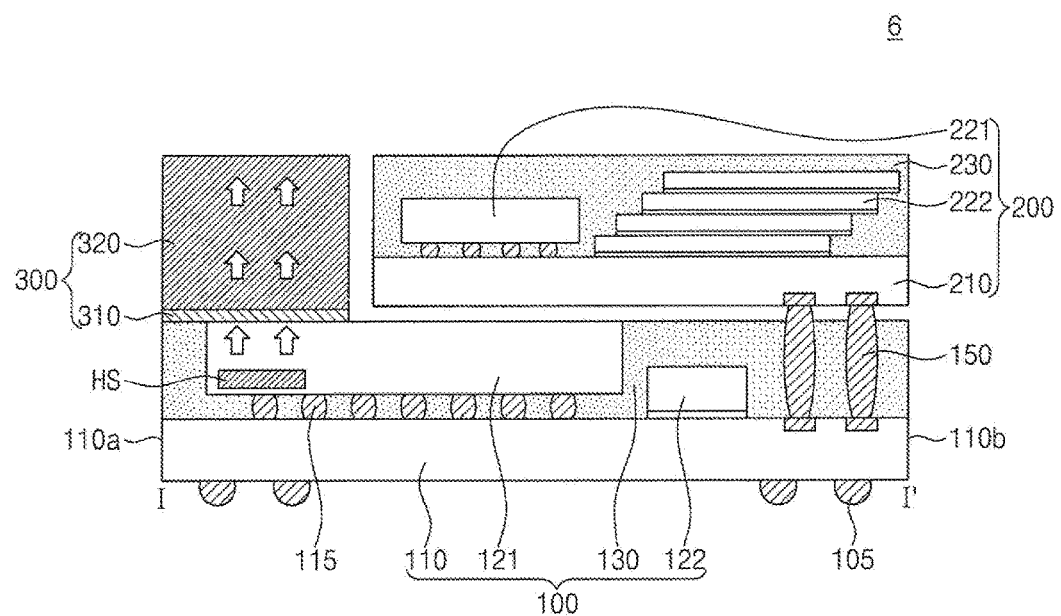
Figure 4C:
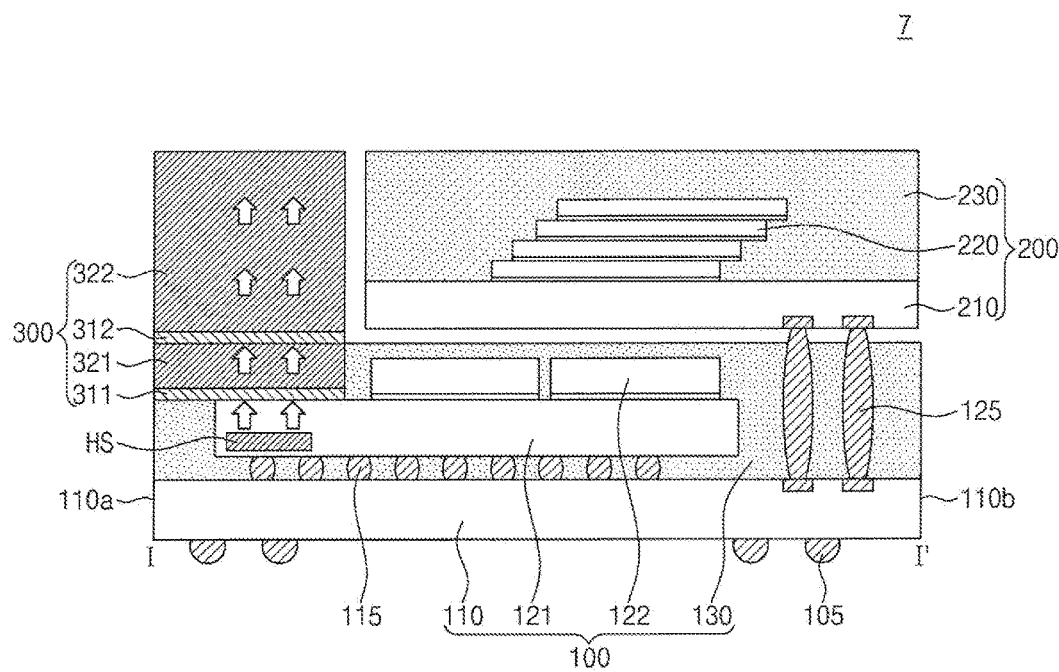

FIGS. 4A through 4C are sectional views illustrating semiconductor packages according to even other example embodiments of the inventive concept. Here, FIGS. 4A through 4C illustrate sections corresponding to the line I-I' of FIG. 1A. For concise description, a previously described element may be identified by a similar or identical reference number without repeating an overlapping description thereof.

Referring to FIG. 4A in conjunction with FIG. 1A, a semiconductor package 5 may include the lower package 100, the upper package 200, and the heat dissipation part 300. The lower package 100, the heat dissipation part 300, the upper substrate 210 and the upper mold layer 230 may be configured to have substantially the same features as those of FIGS. 1A and 1B.

The upper package 200 may include a plurality of semiconductor chips (for example, a first upper semiconductor chip 221 and a second upper semiconductor chip 222). The first upper semiconductor chip 221 and the second upper semiconductor chip 222 may include memory chips different from each other. For example, the first upper semiconductor chip 221 may include a DRAM chip, whereas the second upper semiconductor chip 222 may include a FLASH memory chip. Since heat generated from the hot spot HS can be transmitted to the outside through the heat dissipation part 300, it is possible to reduce heat from being transmitted from the hot spot HS of the lower semiconductor chip 120 to the upper semiconductor chips 221 and 222, when the semiconductor package 5 is operated. This makes it possible to use a heat-sensitive semiconductor chip as the upper semiconductor chips 221 and 222. As another example, the first upper semiconductor chip 221 and the second upper semiconductor chip 222 may be the same type of memory chips.

Referring to FIG. 4B in conjunction with FIG. 1A, a semiconductor package 6 may include the lower package 100, the upper package 200, and the heat dissipation part 300. The lower package 100 may include a plurality of semiconductor chips (for example, a first lower semiconductor chip 121 and a second lower semiconductor chip 122). The first lower semiconductor chip 121 may be the same or similar type of the lower semiconductor chip 120 described with reference to FIGS. 1A and 1B. As an example, the first lower semiconductor chip 121 may be a logic chip. The second lower semiconductor chip 122 may be mounted on the lower substrate 110 and spaced apart from the first lower semiconductor chip 121 in the horizontal direction. The second lower semiconductor chip 122 may be one of a memory chip, a communication chip, and a sensing chip. In certain embodiments, when the lower package 100 is operated, more heat may be generated from the first lower semiconductor chip 121 than from the second lower semiconductor chip 122. For example, when the lower package 100 is operated, the hot spot HS of the first lower semiconductor chip 121 may have a higher temperature than the second lower semiconductor chip 122. The lower mold layer 130 and the upper package 200 may be provided to expose the top surface of the lower semiconductor chip 120 at a position corresponding to the hot spot HS. Accordingly, the heat dissipation part 300 can be provided on the hot spot HS of the first lower semiconductor chip 121 and this makes it possible to effectively transmit heat generated from the hot spot HS of the first lower semiconductor chip 121 to the heat dissipation part 300. Further, since the upper package 200 is not provided on the heat dissipation part 300, heat transmitted to the heat dissipation part 300 can be easily exhausted to the outside.

As described with reference to FIG. 4A, the upper package 200 may include the first upper semiconductor chip 221 and the second upper semiconductor chip 222. In certain embodiments, one of the upper semiconductor chips 221 and 222 may have a more simple routing structure, compared with the lower semiconductor chips 121 and 122, and in this case, it is possible to reduce technical limitations to disposition and the number of the connecting portions 150. However, example embodiments of the inventive concepts may not be limited thereto. As another example, as described with reference to FIGS. 3A and 3B, the interposer substrate 400 may be further provided between the lower package 100 and the upper package 200.

Referring to FIG. 4C in conjunction with FIG. 1A, a semiconductor package 7 may include the lower package 100, the upper package 200, and the heat dissipation part 300. The lower package 100 may include the first lower semiconductor chip 121 and the second lower semiconductor chip 122. Unlike that of FIG. 4B, the lower package 100 may include a plurality of second lower semiconductor chips 122, and the upper package 200 may include a plurality of upper semiconductor chips 220 that are of the same type. As another example, a single upper semiconductor chip 220 may be provided in the upper package 200. The second lower semiconductor chip 122 may be provided on the first lower semiconductor chip 121. The first lower semiconductor chip 121 may include one of a logic chip, a communication chip, and a chip configured to provide both the logic and communication functions. The second lower semiconductor chip 122 may include one of a memory chip, a communication chip, and a sensing chip.

The heat dissipation part 300 may include a first TIM layer 311, a first heat slug 321, a second TIM layer 312, and a second heat slug 322 which are sequentially stacked on the lower package 100. The first heat slug 321 may have a top surface which is substantially coplanar with the top surface of the lower package 100. In particular, the top surface of the first heat slug 321 may be coplanar with a top surface of the lower mold layer 130. The first TIM layer 311 may be interposed between the lower semiconductor chip 121 and the first heat slug 321. The second heat slug 322 may be provided on the first heat slug 321 and spaced apart from the upper package 200 in the horizontal direction. The second TIM layer 312 may be interposed between first and second heat slugs 321 and 322. The top surface of the second heat slug 322 may be coplanar with a top surface of the upper mold layer 230. First and second heat slugs 321 and 322 may include a conductive material (e.g., metals), whose thermal conductivity is higher (e.g., about 401 W/mK) than that of the air.

According to example embodiments of the inventive concept, types of the lower semiconductor chips 121 and 122 and the upper semiconductor chips 221 and 222 can be determined in consideration of properties of the semiconductor chips. For example, the upper semiconductor chips 221 and 222 may have a more simple routing structure, compared with the lower semiconductor chip 121 and 122, and in this case, it is possible to simplify disposition of the connecting portions 150. As another example, the upper semiconductor chips 221 and 222 may be more sensitive to heat, compared to the second lower semiconductor chips 121 and 122. However, example embodiments of the inventive concept will not be limited to the afore-described features of the lower semiconductor chips 121 and 122 and the upper semiconductor chips 221 and 222.

In the case where the lower package 100 includes a second lower semiconductor chip 122 stacked on a first lower semiconductor chip 121, an additional heat slug (not shown) may be further provide between the second lower semiconductor chip 122 and the heat slug 300.

Hereinafter, a package module according to example embodiments of the inventive concept will be described with reference to FIGS. 5A through 5C.

Figure 5A:
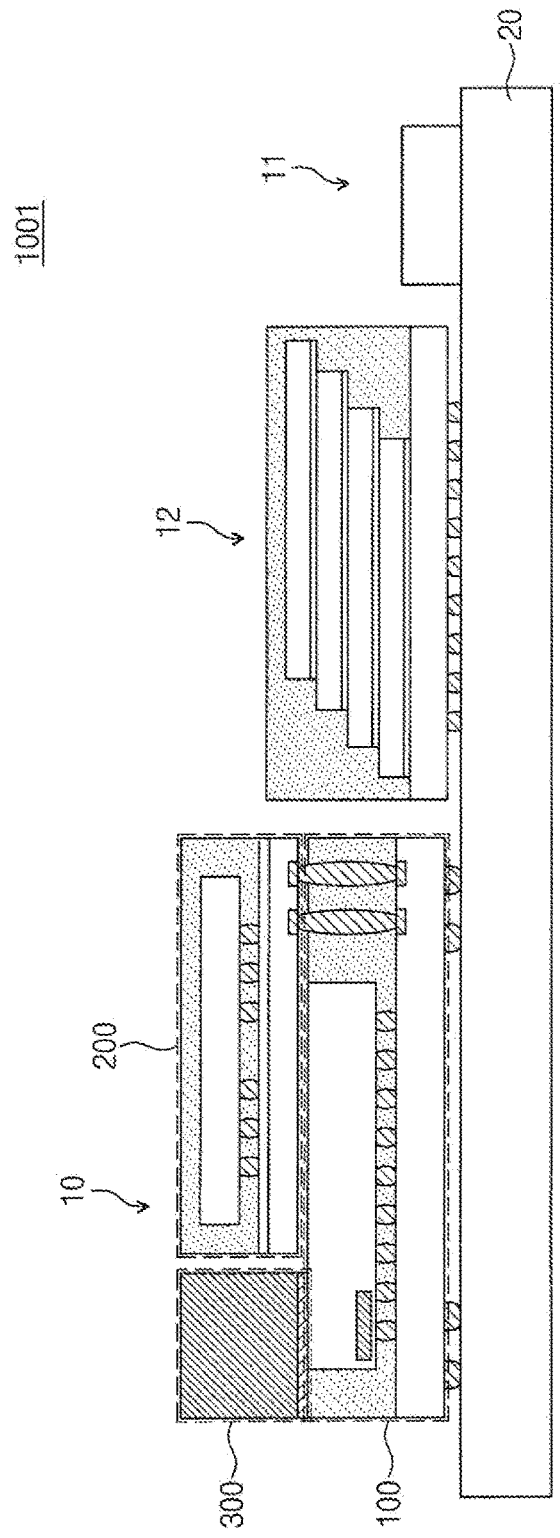
Figure 5B:
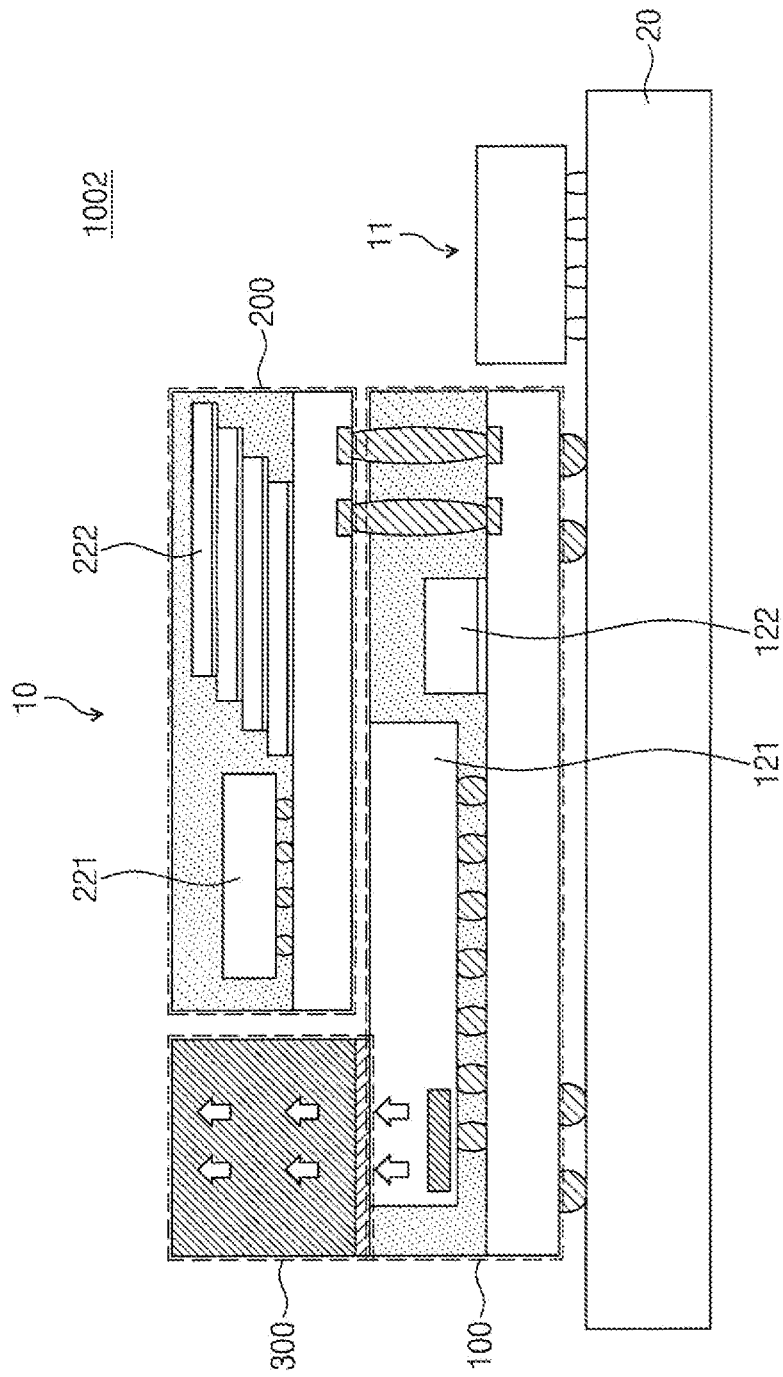

FIGS. 5A through 5C are sectional views illustrating package modules according to example embodiments of the inventive concept. For concise description, a previously described element may be identified by a similar or identical reference number without repeating an overlapping description thereof.

Referring to FIG. 5A, a package module 1001 may include a package substrate 20, a semiconductor package 10, a first electronic device 11, and a second electronic device 12. The semiconductor package 10, the first electronic device 11, and the second electronic device 12 may be mounted on the package substrate 20. The semiconductor package 10 may be one of the semiconductor packages 1, 2, 3, and 4 described with reference to FIGS. 1A through 3C. For example, the semiconductor package 10 may include the lower package 100, the upper package 200 on the lower package 100, and the heat dissipation part 300 on the lower package 100 and laterally spaced apart from the upper package 200. In the case where the upper package 200 is not stacked on the lower package 100, the upper package 200 may be provided on the package substrate 20 to be laterally spaced apart from the lower package 100. According to example embodiments of the inventive concept, since the lower package 100 and the upper package 200 are stacked in the semiconductor package 10, the package module 1001 can be fabricated to have a small form factor. The first electronic device 11 may include at least one of a memory chip, a communication chip, or a sensing chip. The second electronic device 12 may include a semiconductor chip (e.g., a memory chip).

Referring to FIG. 5B, a package module 1002 may include a semiconductor package 10 and a first electronic device 11 mounted on the package substrate 20. In this case, the second electronic device 12 of FIG. 5A may be included in the semiconductor package 10. The semiconductor package 10 may be one of the semiconductor packages 5 and 6 previously described with reference to FIGS. 4A and 4B. For example, the semiconductor package 10 may include the lower package 100, the upper package 200, and the heat dissipation part 300. Here, as shown in FIG. 4A, the upper package 200 may include a plurality of upper semiconductor chips 221 and 222. As another example, the semiconductor package 10 may be configured to include a plurality of lower semiconductor chips 121 and 122 and a plurality of upper semiconductor chips 221 and 222, as shown in FIG. 4B. Accordingly, it is possible to reduce the number of electronic devices or packages to be mounted on the package substrate 20. As a result, the package module 1002 can have a reduced size or form factor, compared with that of FIG. 5A.

Referring to FIG. 5C, a package module 1003 may include a semiconductor package 10 mounted on the package substrate 20. The semiconductor package 10 may be configured to have substantially the same features as the semiconductor package 6 described with reference to FIG. 5C. For example, the semiconductor package 10 may include the lower package 100 and the upper package and heat dissipation part 200 and 300 provided on the lower package 100. In this case, the first electronic device 11 of FIG. 5B may be included in the semiconductor package 10. For example, the first electronic device 11 of FIG. 5B may be an additional semiconductor chip provided in the semiconductor package 10 or may be embedded as a part of the first lower semiconductor chip 121. As a result, the package module 1003 can have a reduced size or form factor, compared with that of FIG. 5B.

Figure 6A:
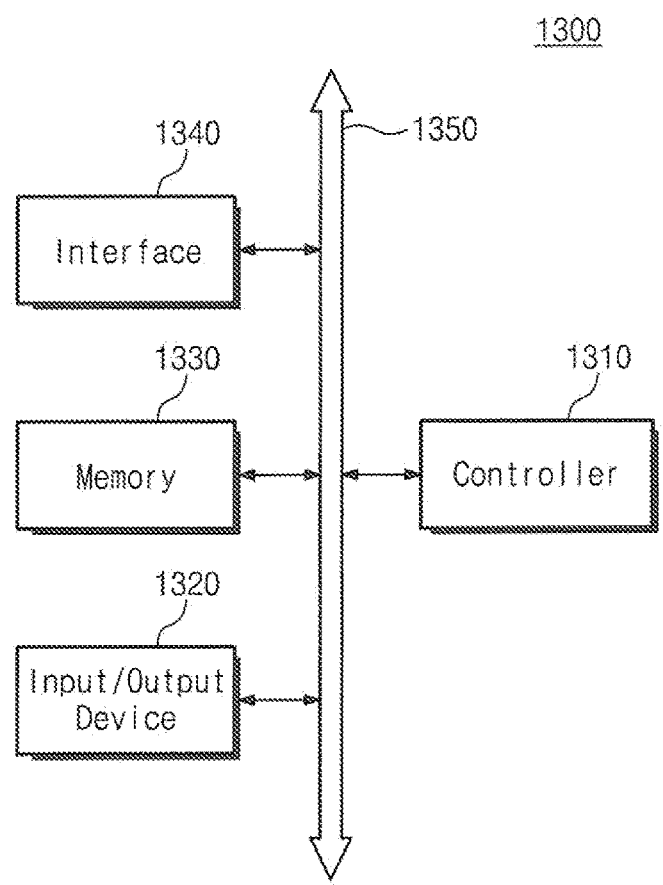
FIG. 6A is a block diagram illustrating an example of electronic systems including a semiconductor package according to example embodiments of the inventive concept.
Figure 6B:
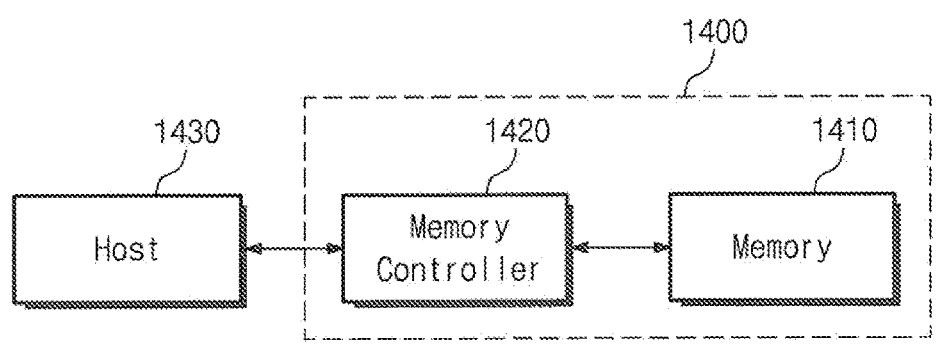
FIG. 6B is a block diagram illustrating an example of memory cards including a semiconductor package according to example embodiments of the inventive concept.

FIG. 6A is a block diagram illustrating an example of electronic systems including a semiconductor package according to example embodiments of the inventive concept. FIG. 6B is a block diagram illustrating an example of memory systems including a semiconductor package according to example embodiments of the inventive concept.

Referring to FIG. 6A, an electronic system 1300 may include a controller 1310, an input/output (I/O) unit 1320, and a memory device 1330. The controller 1310, the I/O unit 1320 and the memory device 1330 may be combined with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor and the microcontroller. The controller 1310 and the memory device 1330 may include one of the semiconductor packages 1 and 2 according to example embodiments of the inventive concept. The I/O unit 1320 may include a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as solid state disks (SSD). In this case, the electronic system 1300 may stably store mass data to the flash memory system. The electronic system 1300 may further include an interface unit 1340 which transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, an application chipset, a camera image processor (CIS), and/or an input/output unit may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 6B, a memory system 1400 may include a non-volatile memory device 1410 and a memory controller 1420. The non-volatile memory device 1410 and the memory controller 1420 may store data or read stored data. The non-volatile memory device 1410 may include at least one of the semiconductor packages 1 and 2 according to example embodiments of the inventive concept. The memory controller 1420 may control the non-volatile memory device 1410 in order to read the stored data and/or to store data in response to read/write request of a host 1430.

According to example embodiments of the inventive concept, a semiconductor package may include a heat dissipation part and an upper package provided on a lower package. The heat dissipation part may be disposed to be overlapped with a hot spot of the lower semiconductor chip, when viewed in a plan view. Accordingly, it is possible to quickly exhaust heat generated from a lower semiconductor chip to the outside through the heat dissipation part, when the semiconductor package is operated. This makes it possible to improve a thermal property and operation reliability of the lower semiconductor chip.

The upper package may be disposed not to be overlapped with the hot spot of the lower semiconductor chip, when viewed in a plan view. Accordingly, heat generated from lower semiconductor package may not be transmitted to an upper semiconductor chip, when the semiconductor package is operated. This makes it possible to improve operation reliability of the upper semiconductor chip. Further, this also makes it possible to use a heat-sensitive semiconductor chip as the upper semiconductor chip.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
  a lower package including a lower substrate and a lower semiconductor chip on the lower substrate, the lower package having a first region and a second region, wherein the first region is adjacent to a first side of the lower substrate and the second region is adjacent to a second side of the lower substrate facing the first side of the lower substrate, wherein the lower semiconductor chip partially overlaps the first region and the second region;
  a heat dissipation part on the first region of the lower package, wherein the heat dissipation part covers a first portion of the lower semiconductor chip in the first region of the lower package and exposes a second portion of the lower semiconductor chip in the second region of the lower package; and
  an upper package on the second region of the lower package, wherein the upper package is spaced apart laterally from the first region.

2. The semiconductor package of claim 1, wherein the upper package is stacked vertically on the lower package.

3. The semiconductor package of claim 1, wherein the lower semiconductor chip comprises a hot spot therein,
  wherein the heat dissipation part is stacked vertically on the lower package, and
  wherein the hot spot is in the first region and overlaps laterally with the heat dissipation part.

4. The semiconductor package of claim 3, wherein the hot spot is in a portion of the lower semiconductor chip that is adjacent to the first side of the lower substrate.

5. The semiconductor package of claim 1, further comprising an interposer substrate on the second region of the lower package between the lower and upper packages.

6. The semiconductor package of claim 5, further comprising:
  connecting portions between the lower substrate and the interposer substrate; and
  interposers between the interposer substrate and the upper package,
  wherein the interposers are disposed above different positions of the lower substrate than the connecting portions.

7. The semiconductor package of claim 1, further comprising connecting portions on the lower substrate to connect the upper package electrically to the lower package, wherein the connecting portions are disposed in the second region of the lower package.

8. The semiconductor package of claim 1, wherein the lower semiconductor chip comprises a first lower semiconductor chip and a second lower semiconductor chip that is of a different type from the first lower semiconductor chip.

9. The semiconductor package of claim 1, wherein the heat dissipation part comprises a first portion above the first region of the lower package and a second portion above the second region of the lower package, wherein the first portion of the heat dissipation part has a first height that is greater than a second height of the second portion of the heat dissipation part.

10. The semiconductor package of claim 1, wherein the heat dissipation part comprises:
  a heat slug on the lower semiconductor chip; and
  a thermal interface material layer in a gap region between the lower semiconductor chip and the heat slug.

11. A semiconductor package of claim 1, wherein the upper package is laterally spaced apart from the heat dissipation part.

12. A semiconductor package of claim 1, wherein a top surface of the heat dissipation part is exposed to outside.

13. A semiconductor package, comprising:
  a lower package including a lower substrate and a lower semiconductor chip;
  an upper package on the lower package and exposing a portion of an upper surface of the lower semiconductor chip; and
  a heat dissipation part on the exposed portion of the upper surface of the lower semiconductor chip and laterally adjacent the upper package, wherein the heat dissipation part comprises:
  a heat slug on the lower semiconductor chip; and
  a thermal interface material layer in gaps between the lower semiconductor chip and the heat slug and between the lower semiconductor chip and the upper package.

14. The semiconductor package of claim 13, wherein the lower semiconductor chip has a hot spot therein, and wherein the heat dissipation part overlaps the hot spot, when viewed in a plan view.

15. The semiconductor package of claim 13, wherein a first space between the lower semiconductor chip and a first vertical side of the lower substrate is smaller than a second space between the lower semiconductor chip and a second vertical side of the lower substrate opposite to the first side.

16. The semiconductor package of claim 13, wherein the heat dissipation part has a thermal conductivity higher than that a thermal conductivity of the upper package.

17. The semiconductor package of claim 13, wherein the lower package further comprises a lower mold layer on the lower substrate, and the lower mold layer covers side surfaces of the lower semiconductor chip and exposes a top surface of the lower semiconductor chip.

18. The semiconductor package of claim 13, further comprising an upper thermal interface material layer in a gap region between the heat dissipation part and the upper package.

* * * * *